United States Patent [19]

Parthasarathi

[11] Patent Number: 5,156,716
[45] Date of Patent: Oct. 20, 1992

[54] PROCESS FOR THE MANUFACTURE OF A THREE LAYER TAPE FOR TAPE AUTOMATED BONDING

[75] Inventor: Arvind Parthasarathi, North Branford, Conn.

[73] Assignee: Olin Corporation, New Haven, Conn.

[21] Appl. No.: 691,914

[22] Filed: Apr. 26, 1991

[51] Int. Cl.[5] .................. B44C 1/22; B29C 37/00; C23F 1/00
[52] U.S. Cl. ................... 156/633; 156/634; 156/643; 156/644; 156/654; 156/656; 156/659.1; 156/668; 156/902
[58] Field of Search .............. 156/629, 630, 633, 634, 156/640, 644, 650, 654, 656, 659.1, 901, 902, 252, 643, 668; 29/846, 852, 827; 437/206, 220; 174/250, 255, 259, 268; 357/70; 361/421; 428/209, 901

[56] References Cited

U.S. PATENT DOCUMENTS

| Re.31,967 | 8/1985 | Burns | 430/314 |
|---|---|---|---|
| 2,893,315 | 7/1959 | Tann | 156/902 X |
| 3,301,730 | 1/1967 | Spiwak et al. | 156/267 |
| 3,437,522 | 4/1969 | Fick et al. | 134/38 |
| 3,448,516 | 6/1969 | Buck | 29/846 X |
| 3,480,836 | 11/1969 | Aronstein | 156/630 X |
| 4,087,300 | 5/1978 | Adler | 156/184 |
| 4,354,895 | 10/1982 | Ellis | 156/631 |
| 4,694,572 | 9/1987 | Leber et al. | 29/840 |
| 4,982,495 | 1/1991 | Okamoto et al. | 29/846 |
| 4,997,517 | 3/1991 | Parthasarathi | 156/630 |
| 5,025,114 | 6/1991 | Braden | 174/52.4 |
| 5,065,228 | 11/1991 | Foster et al. | 357/80 |

OTHER PUBLICATIONS

Electronic Materials Handbook, ASM International, vol. 1 1989, pp. 476-479.

*Primary Examiner*—William A. Powell
*Attorney, Agent, or Firm*—Gregory S. Rosenblatt; Paul Weinstein

[57] ABSTRACT

A method for the manufacture of an electronic circuit is provided. A non-conductive substrate is provided with an indexing means and personality windows by etching. An adhesive is deposited on one surface of the substrate to coat at least those regions to be laminated to a metallic foil. The foil is bonded to the non-conductive substrate and patterned into a plurality of circuit traces. Mechanical stamping of the substrate is not required providing a means to inexpensively manufacture small quantities of a desired circuit configuration.

20 Claims, 2 Drawing Sheets

PROCESS FOR THE MANUFACTURE OF A THREE LAYER TAPE FOR TAPE AUTOMATED BONDING

BACKGROUND OF THE INVENTION

1. Field of the Invention.

This invention relates to a process for the manufacture of an interconnect circuit for semiconductor devices. More particularly, the invention relates to a process for the manufacture of a circuit for tape automated bonding having a conductive layer bonded to a polyimide substrate by an adhesive.

2. Description of Related Art.

Microelectronic devices such as silicon based semiconductor integrated circuits are encased in a housing to protect the fragile circuitry from mechanical or corrosive damage. One housing is formed by encasing the microelectronic device between a base and a cover. Alternatively, the housing may be a plastic resin molded around the device. An electrically conductive leadframe passes through the housing to transmit electrical signals between the device and external circuitry. Interconnection between the leadframe and input/output (I/O) pads on the microelectronic device is either by thin wire bonds or an interconnect tape.

The interconnect tape, commonly referred to as TAB (for tape automated bonding) tape is formed into a plurality of individual sites. Each site defines a plurality of narrow leads arranged to extend outwardly from the integrated circuit device. The inner lead portions are bonded to I/0 pads on a surface of the device. The outer lead portions are bonded to a leadframe, circuit board or other external circuitry.

TAB tape is provided in several formats. A single layer tape has an all metal construction. A two layer construction has a metal layer supported by a dielectric backing layer. A three layer construction has a metal layer adhesively bonded to a dielectric support layer. The dielectric support layer is typically a polyimide such as KAPTON manufactured by Dupont. The thickness of the dielectric support layer ranges from about 2 mils up to about 5 mils.

The metal foil layer is usually copper or a dilute copper alloy having a thickness of from about $\frac{1}{2}$ to 6 mils. Leads are patterned in the foil by photolithography. Lead widths as thin as 2 mils are commercially produced. The use of copper or a dilute copper alloy provides high electrical conductivity.

U.S. Pat. No. 4,982,495 to Okimoto et al discloses one manufacturing process for a three layer TAB tape. An adhesive is coated on a polyimide film. Sprocket holes and a personality window are punched through both the adhesive and the polyimide film. A copper foil is laminated to the adhesive and then a lead pattern is formed in the copper by photolithography.

One problem with this method is a separate punch tool is needed for each site configuration. The punch stamps through the polyimide and adhesive to define the personality window and sprocket holes used to guide the TAB tape through the remaining assembly procedures and bonding to the microelectronic device. While the tooling costs may be amortized over an extended production run, the costs are often prohibitive for a specialized site configuration or for evaluation of a tape design.

One way to reduce the cost of manufacturing a tape configuration and to reduce the time necessary to transfer a circuit design to the polyimide supported tape is by etching the sprocket holes and personality window in the polyimide and adhesive. This technique has met with minimal success because polyimide is soluble in concentrated alkaline solutions such as potassium hydroxide or sodium hydroxide and most conventional adhesives are soluble in concentrated acids such as sulfuric acid or organic solvents such as methylethyl ketone.

Immersion in two separate etching solutions, such as a hydroxide followed by an acid is one solution. This approach is not economical and has the difficulty of identifying a masking compound which is chemically resistant to both solutions and readily removed subsequent to etching.

SUMMARY OF THE INVENTION

Accordingly, it is an object of the present invention to develop a method for the manufacture of a three layer tape which does not have the limitations of the prior art. It is a feature of the invention that personality windows and sprocket holes are etched in a nonconductive substrate. An adhesive is deposited on the etched substrate and a copper foil is then laminated. Another feature of the invention is that the adhesive is either deposited over selected regions or over the entire substrate. It is an advantage of the process that any TAB site configuration may be economically manufactured. Another advantage of the invention is that no punching tools are required. Yet another advantage of the invention is that the processes of depositing the adhesive and laminating the copper may be done in a continuous sequence. Another advantage of the invention is that the adhesive may be selectively deposited by screen printing or, alternatively, deposited by spraying. A disposable backing plate removes adhesive residue deposited in sprocket holes, personality windows or beyond the edges of the tape.

In accordance with the invention, there is provided a process for the manufacture of a circuit. The process comprises the steps of forming a plurality of apertures in a nonconductive substrate. An adhesive is deposited on the substrate. A conductive foil is then bonded to the nonconductive substrate by means of the deposited adhesive.

BRIEF DESCRIPTION OF THE DRAWINGS

The above stated objects, features and advantages will become more apparent from the specification and drawings which follow.

DETAILED DESCRIPTION OF THE PREFERRED EMBODIMENTS

Figure 1:
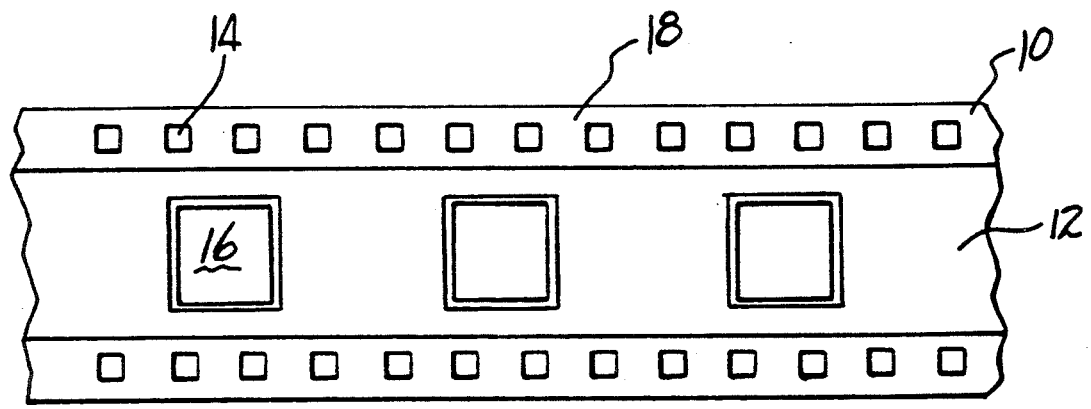
FIG. 1 shows in top planar view an etched nonconductive substrate to which an adhesive has been selectively applied.
Figure 2:
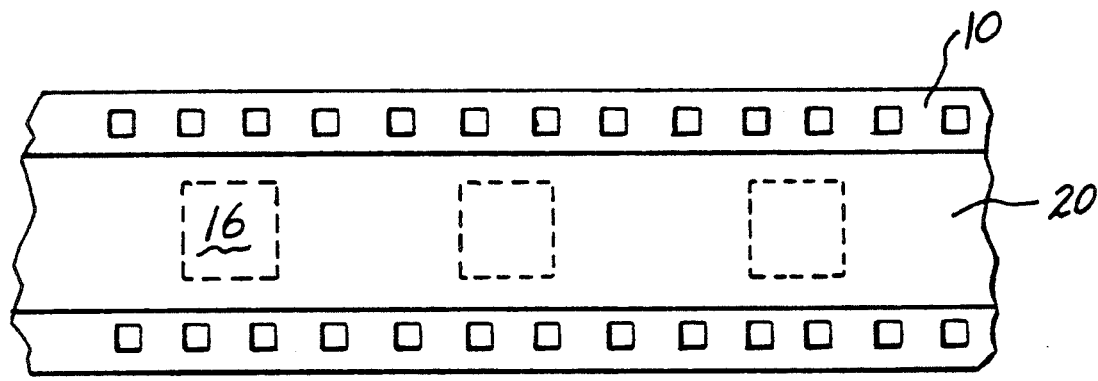
FIG. 2 shows in top planar view the nonconductive substrate of FIG. 1 subsequent to lamination of a conductive foil.
Figure 3:
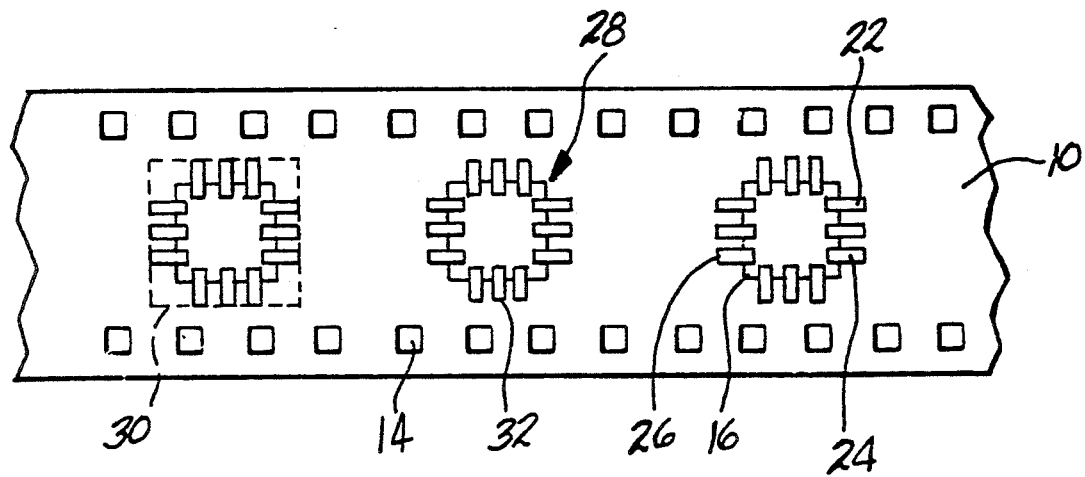
FIG. 3 shows in top planar view the nonconductive substrate of FIG. 2 subsequent to imaging of the leads.

FIGS. 1 through 3 demonstrate the essential sequence of steps for the manufacture of a circuit in accordance with the invention. In FIG. 1, a nonconductive substrate 10 is coated with an adhesive 12. The substrate 10 may be manufactured from any polymer based dielectric material suitable for electronic circuits such as Polyester, polycarbonate, polyimide, glass fiber filled epoxy, polyvinylchloride and polyethersulfone. Features are formed in the substrate 10 by chemical etching. The reactivity of different materials to the etch varies and it is Preferable to use an unfilled polymer as opposed to a filled or nonhomogenious material. To minimize the cost and increase throughput, it is preferred for the substrate 10 to be flexible for winding about a rotating spool or other collector means.

When a liquid etch solution is used, the area of the substrate first contacting the etching solution is removed to a greater extent than portions which only contact the solution when exterior material is removed. The reason for the difference is two-fold. The etch solution is in contact with the interior portions for a reduced time. Also, the etch solution must pass through a narrow via to reach the interior portions. Circulation of the solution is reduced, leading to a reduction in efficiency. The difference between the largest etched cross-sectional area and the minimum, is referred to as the aspect ratio. A minimum aspect ratio is preferred to improve the definition of the tape features. One method to reduce the aspect ratio is to minimize the thickness of the substrate. Preferably, the thickness is under 10 mils and most preferably, from about 2 mils to about 5 mils.

Among the features to be formed in the substrate 10 are an indexing means 14 and personality window 16. The indexing means 14 positions the tape for etching of metallic circuit traces and for automated bonding of a device to the circuit traces. One indexing means is sprocket holes. The sprocket holes are a plurality of equally spaced apertures forming two parallel rows which run along transverse edges 18 of the substrate 10. Personality windows 16 are centrally positioned on the substrate 10 and provide an aperture for receiving the inner ends of the metallic foil leads and an integrated circuit device.

The indexing means 14 and personality windows 16 are formed by etching. Either a wet etch using a liquid chemical medium or a dry etch using a plasma medium may be employed. For wet etching, a photoactive chemical resist is deposited over either one or both surfaces of the substrate 10. The resist is selected to be chemically inert in the etching solution. When the substrate is a polyimide, the etching solution is a strong base a and suitable caustic resistant resist is employed.

A mask is used to cover either one or both surfaces of the resist coated substrate. The mask has a series of apertures so that when exposed to a light source, those portions of the resist covering the personality windows 16 and indexing means 14 are exposed. A suitable wavelength light source, typically ultraviolet, is radiated through the mask to expose the desired portions of the photo-sensitive resist. After exposure, the exposed portions of the resist are soluble in a solvent. The exposed resist is removed, exposing the underlying polyimide substrate.

While the imaging of the photosensitive chemical resist has been described in terms of a negative photoresist, a positive photoresist where the exposed regions become insoluble in a solvent may also be employed.

The resist is applied to both sides of the substrate 10 prior to immersion in the etch solution. Photoimaging of sprocket holes and personality windows in the resist on both sides of the dielectric substrate and then etching from both sides reduces the aspect ratio. The difficulty of aligning the small features on both sides of the tape usually negates the advantage of the reduced aspect ratio. It is preferable to photoimage the personality windows and sprocket holes on one side of the dielectric substrate only and etch through to the opposite side. For single side etching, the resist on the back side of the substrate need not be photoactive. Any suitable resist may be used.

When the non-conductive substrate 10 is a polyimide, suitable etching solutions include potassium hydroxide, ammonium hydroxide and sodium hydroxide. The maximum etch rate is achieved with a concentrated solution of potassium hydroxide. KOH concentrations of from about 25% by weight to about 75% by weight are satisfactory. The caustic is heated to a temperature of from about 65° C. to about 85° C. Etching is quite rapid and features are formed in a 5 mil thick Polyimide substrate in about 1 to 5 minutes.

Once the indexing means 14 and personality windows 16 have been etched through the substrate 10, the remaining resist is removed by immersion in a suitable solvent. The substrate 10 is then ready for application of the adhesive 12.

Rather than use a liquid chemical etch, a dry etch using either an oxygen or an $O_2/CF_4$ plasma may be utilized. A thin metallic mask which is inert in the plasma is applied over one or both surfaces of the non-conductive substrate. The substrate is then placed in a vacuum chamber containing a small concentration of the desired gas. When a sufficiently high voltage is applied, a plasma is generated. The plasma etches the exposed non-conductive substrate, forming the indexing means and personality windows and preparing the substrate 10 for application of the adhesive 12.

The adhesive 12 covers a central portion of the non-conductive substrate 10. If positioning of the adhesive is controllable, such as with screen printing, it is desirable that the adhesive 12 not enter the indexing means 14 or sprocket holes 16. When a metallic foil is laminated to the non-conductive substrate 10 with the adhesive 12 disposed therebetween, the adhesive 12 will flow. The adhesive should be positioned an effective distance from both the indexing means 14 and personality windows 16 so that during lamination and cure, the adhesive does not flow into the features. Preferably, the adhesive 12 is deposited up to from about 0.5 to about 2 mils from the indexing means 14 and personality window 16. The adhesive 12 need not be applied between sprocket holes or along the transverse edges of the non-conductive substrate 10 exterior to the indexing means 14.

The adhesive may be any non-conductive material capable of bonding a metallic foil to the non-conductive substrate. When the non-conductive substrate 10 is polyimide and the metallic foil is copper, one suitable adhesive is phenolic butyral. A thin layer, typically from about 0.3 mils to about 0.7 mils of adhesive is applied to the desired region.

As shown in FIG. 2, a metallic foil 20 is laminated to the non-conductive substrate 10 using sufficient heat and pressure that the adhesive adheres to both. The metallic foil 20 covers the personality windows (shown in phantom at 16). The metallic foil may be any suitable electrically conductive material. Preferably, the metallic foil 20 is etchable in a solution which does not attack the non-conductive substrate 10. When the non-conductive substrate 10 is a Polyimide, the metallic foil is selected to be etchable in a mineral acid. A most preferred metallic foil is copper or a copper alloy which is readily dissolvable in many commercial etchants such as $FeCl_3$ or $CuCl_2/HCl$. The metallic foil 20 is thin, preferably under 5 mils thick and most preferably, from about 0.7 mils to about 1.4 mils.

The metallic foil 20 is then covered with a suitable photosensitive chemical resist and patterned into a series of leads using photolithography. As shown in FIG. 3, the leads 22 have inner lead ends 24 which extend in cantilever fashion into the personality windows 16. The outer lead ends 26 are supported by the non-conductive substrate 10.

The tape automated bonding site 28 is now ready for automated positioning using indexing means 14 for bonding to an integrated circuit device. Once the inner lead ends 24 are bonded to the integrated circuit device, the site 28 is severed from the dielectric substrate 10 along a perimeter (shown in phantom 30) approximately defined by the terminations of the outer leads 26.

The process of the invention is characterized by a high degree of flexibility in that any indexing means and sprocket hole pattern may be readily etched into the non-conductive substrate using Photo-imaging. Positioning of the adhesive layer may be continuous and automated as illustrated in FIGS. 4 and 5.

Figure 4:
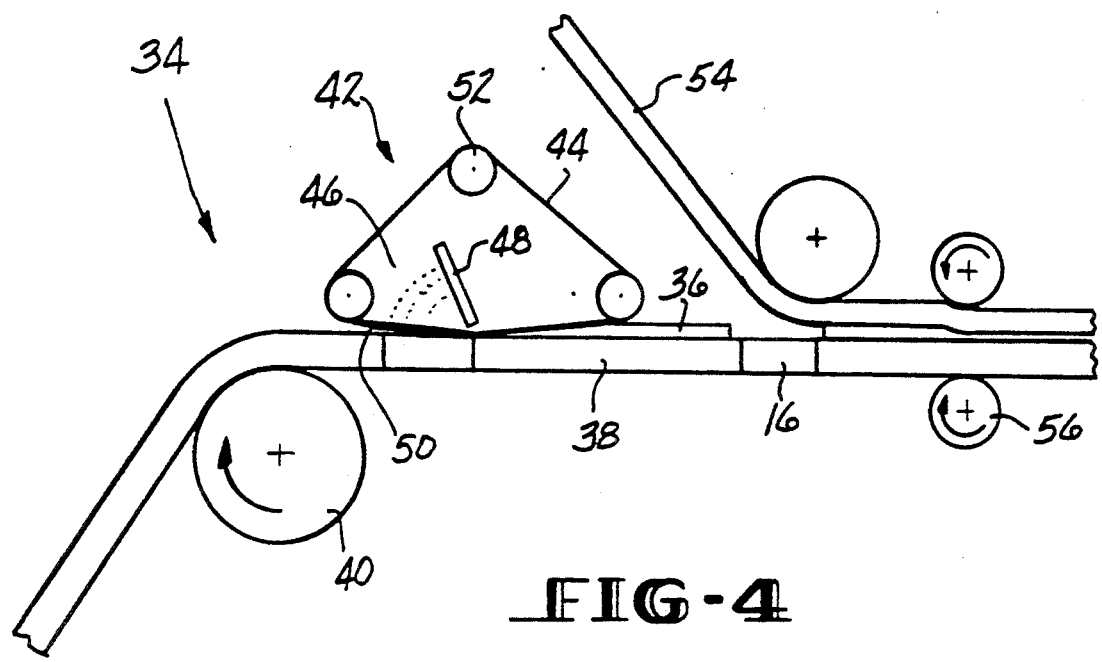
FIG. 4 shows an apparatus for continuously manufacturing a flexible circuit having selectively deposited adhesive.

FIG. 4 shows an apparatus 34 for depositing an adhesive layer 36 on selected portions of a non-conductive substrate 38. The non-conductive substrate 38 contains personality windows 16 formed by etching. The non-conductive substrate 38 is provided to the apparatus 34 in reel form. Guide roll 40 directs the substrate past continuous screen printer 42. The continuous screen printer 42 contains a screen 44 in the form of a continuous belt. The screen 44 is substantially open to permit the adhesive resin 46 to be forced through the screen by means of squeegee 48. A portion 50 of the screen is closed such that when portion 50 is in contact with squeegee 48, no adhesive resin 46 passes through the screen for deposition on non-conductive substrate 38. The continuous belt screen 44 rotates about drums 52 at a rate effective to ensure the closed screen portion 50 is in contact with the squeegee 48 when a Personality window 16 passes. Any system of automated control may be used to regulate the screen speed. One Preferred mechanism is to utilize the sprocket holes formed in the non-conductive substrate 38 to control the speed of the belt 44 and positioning of the closed screen portion 50.

The squeegee 48 applies sufficient pressure to extrude adhesive resin through the screen to a thickness of from about 0.3 to about 0.7 mils. The non-conductive substrate 38 bearing the adhesive level 36 is then laminated to a layer of copper foil 54. A matched set of pinch rollers 56 laminate the copper foil 54 to the non-conductive substrate 38 by means of the adhesive layer 36. Preferably, the pinch rollers 56 are heated to a temperature of from about 150° C. to about 200° C. to accelerate the polymerization of the adhesive layer 36 to improve the bond between foil 54 and substrate 38.

Figure 5:
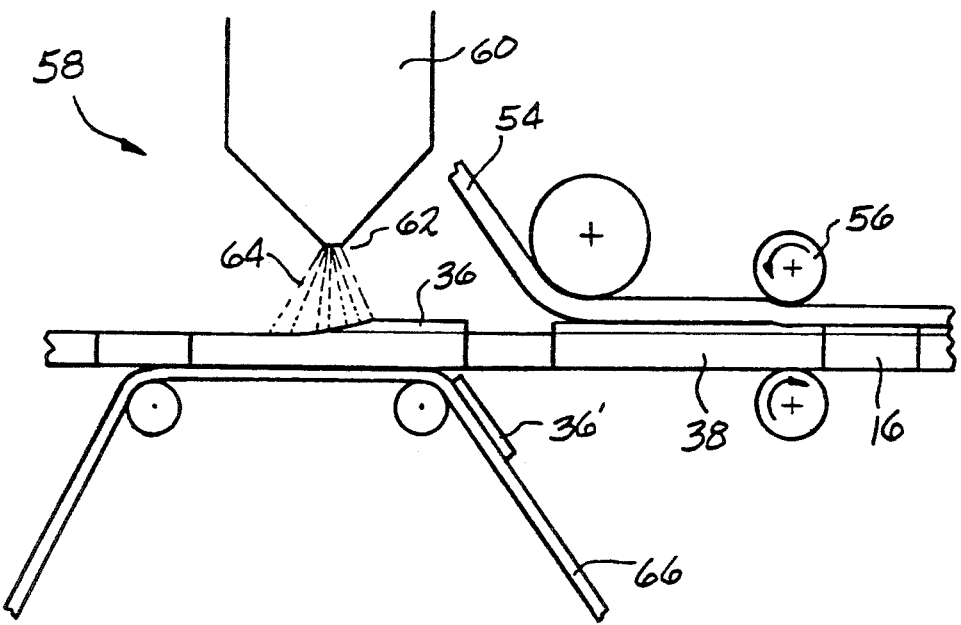
FIG. 5 shows an apparatus for the manufacture of a flexible circuit having adhesive randomly deposited and including a backing means.

FIG. 5 illustrates a second apparatus 58 for applying an adhesive layer 36 to a non-conductive substrate 38. The non-conductive substrate 38 is driven by pinch rollers 56 past spray apparatus 60. The spray apparatus 60 may be any conventional spraying means. Typically, an adhesive resin is contained within the spray apparatus. A compressed gas source forces the adhesive resin through an orifice 62 which expels the resin as a plurality of droplets 64. To reduce the viscosity of the adhesive resin, the resin may be mixed with a solvent to permit a fine, uniform dispersion of droplets 64. The droplets 64 are deposited randomly on a surface of the non-conductive substrate 38. A backing plate 66 is positioned on the opposite side of the non-conductive substrate 38. The backing plate 66 recovers that portion of the adhesive resin 36' which was deposited in the personality windows 16 and the sprocket holes.

The backing plate may be any thin, flexible material. The backing plate may be a disposable medium such as paper or waxed paper and both the backing layer 66 and the adhesive layer 36' may be disposed after use. Alternatively, the backing plate may be a polymer or metal foil which is inert in a solvent which dissolves the adhesive portion 36'. The backing plate 66 may be immersed in the solvent for removal of the excess adhesive layer 36' and then the backing plate may be reused. One preferred backing plate is copper foil. If the adhesive is polyvinyl butyral, isopropyl alcohol can be used as a solvent to permit reuse of the backing plate.

Following deposition of the adhesive layer 36, a layer of copper foil 54 is laminated to the non-conductive substrate 38 by means of pinch rolls 56 as described above.

While the deposition of the adhesive layer has been described in terms of continuous screen printing and spray coating, other methods of depositing a liquid are also acceptable. For example, both roller coating and dip coating may be applied to the process of the invention.

While the invention has been described in terms of a process for the manufacture of a flexible circuit for tape automated bonding, it is equally applicable to any flexible circuit and may be readily adapted to the manufacture of rigid or semi-rigid circuits as well.

The patents set forth in this application are incorporated by reference herein.

It is apparent that there has been provided in accordance with this invention a method for the manufacture of a circuit which fully satisfies the objects, means and advantages set forth hereinabove. While the invention has been described in combination with the embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

I claim:

1. A process for the manufacture of a circuit, comprising the steps of:
   a) etching a plurality of apertures in a non-conductive substrate;
   b) depositing an adhesive on said non-conductive substrate; and
   c) bonding a conductive foil to said non-conductive substrate by means of said adhesive.

2. The process of claim 1 wherein said non-conductive substrate is selected from the group consisting of polyester, polycarbonate, polyimide, glass-filled epoxy, polyvinylchloride and polyethersulfone.

3. The process of claim 2 wherein said non-conductive substrate is selected to be a polyimide.

4. The process of claim 2 wherein said plurality of apertures comprises two rows of parallel holes running along the transverse edges of said non-conductive substrate and centrally positioned personality windows.

5. The process of claim 4 wherein the thickness of said non-conductive substrate is from about 2 to about .5 mils.

6. The process of claim 4 wherein said plurality of apertures are formed by chemical etching.

7. The process of claim 6 wherein said chemical etch is a liquid selected from the group consisting of potassium hydroxide, sodium hydroxide and ammonium hydroxide.

8. The process of claim 7 wherein said etching solution is potassium hydroxide and said non-conductive substrate is a polyimide.

9. The process of claim 6 wherein said etch is a plasma gas selected from the group consisting of $O_2$ and $O_2/CF_4$.

10. The process of claim 6 wherein said adhesive is deposited on said non-conductive substrate by a means selected from the group consisting of screen printing, spray coating, roller coating and dip coating.

11. The method of claim 10 wherein said adhesive is deposited by screen coating.

12. The process of claim 11 wherein said adhesive is selectively deposited over the entire central surface of said non-conductive substrate up to a distance from said parallel rows of apertures and from said personality windows effective to prevent migration of said adhesive into said parallel rows of apertures and personality windows during bonding of said conductive foil to said deposited adhesive.

13. The process of claim 12 wherein said adhesive extends to from about 0.5 to about 2 mils of said parallel rows of apertures and said personality windows.

14. The process of claim 13 wherein said conductive foil is laminated to said non-conductive substrate by bonding to said adhesive, the width of said conductive foil being defined by the width of said adhesive.

15. The process of claim 6 wherein said adhesive is deposited by spray coating.

16. The process of claim 15 further including a backing means to recover and remove adhesive deposited in said plurality of apertures.

17. The process of claim 16 wherein said backing means is selected from the group consisting of paper, waxed paper, polymer films and metallic foil.

18. The process of claim 17 wherein said backing means is selected to be a metallic foil which is non-reactive in a solvent suitable for dissolving said adhesive prior to polymerization.

19. The process of claim 18 wherein said backing means is selected to be copper and said suitable solvent is isopropyl alcohol.

20. The process of claim 6 wherein said non-conductive substrate is selected to be a polyimide, said adhesive is selected to be phenolic butyral and said conductive foil is selected to be copper or a copper based alloy, said conductive foil patterned into a plurality of circuit traces.

* * * * *